(12) United States Patent
Lee (10) Patent No.: US 8,351,282 B2
(45) Date of Patent: Jan. 8, 2013

(54) SEMICONDUCTOR MEMORY APPARATUS

(75) Inventor: Hyeng Ouk Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 208 days.

(21) Appl. No.: 12/970,925

(22) Filed: Dec. 16, 2010

(65) Prior Publication Data
US 2012/0106274 A1    May 3, 2012

(30) Foreign Application Priority Data

Oct. 29, 2010   (KR) .................. 10-2010-0107056

(51) Int. Cl.
*G11C 7/00* (2006.01)
(52) U.S. Cl. .... 365/193; 365/191; 365/194; 365/189.05
(58) Field of Classification Search .................. 365/193, 365/191, 194, 189.05
See application file for complete search history.

(56) References Cited

U.S. PATENT DOCUMENTS

| | | | |
|---|---|---|---|
| 5,384,750 A | 1/1995 | Lee | |
| 5,568,445 A * | 10/1996 | Park et al. | ........... 365/233.1 |
| 5,892,730 A | 4/1999 | Sato et al. | |
| 6,337,809 B1 | 1/2002 | Kim et al. | |
| 6,377,511 B1 * | 4/2002 | Okuda et al. | ........... 365/233.11 |
| 7,663,946 B2 * | 2/2010 | Kim | ........... 365/194 |
| 2007/0147142 A1 | 6/2007 | Schnell et al. | |

FOREIGN PATENT DOCUMENTS

| | | |
|---|---|---|
| JP | 10-334659 | 12/1998 |
| JP | 2003-068077 | 3/2003 |
| JP | 2003-085999 | 3/2003 |
| KR | 1020040023804 A | 3/2004 |
| KR | 1020050115563 A | 12/2005 |

* cited by examiner

*Primary Examiner* — Son Dinh
(74) *Attorney, Agent, or Firm* — William Park & Associates Ltd.

(57) ABSTRACT

A semiconductor memory apparatus includes a data input enable signal generation block configured to sequentially delay a data strobe signal to generate a first delayed data strobe signal, a second delayed data strobe signal, a third delayed data strobe signal and a fourth delayed data strobe signal, and generate a data strobe enable signal in response to a CAS write signal, a CAS write latency signal and the first to fourth delayed data strobe signals, a latch control signal generation block configured to output the data strobe signal as a latch control signal during an enable period of the data strobe enable signal, and a data latch block configured to latch data in response to the latch control signal and output latched data.

15 Claims, 6 Drawing Sheets

SEMICONDUCTOR MEMORY APPARATUS

CROSS-REFERENCES TO RELATED APPLICATION

The present application claims priority under 35 U.S.C. §119(a) to Korean Application No. 10-2010-0107056, filed on Oct. 29, 2010, in the Korean Intellectual Property Office, which is incorporated herein by reference in its entirety as set forth in full.

BACKGROUND

1. Technical Field

The present invention relates to a semiconductor integrated circuit, and more particularly, to a semiconductor memory apparatus.

2. Related Art

A semiconductor memory apparatus receives data from outside, stores the data and outputs the stored data. Such a semiconductor memory apparatus receives data and a data strobe signal from outside, latches data inputted from outside, and stores the latched data.

Figure 1:
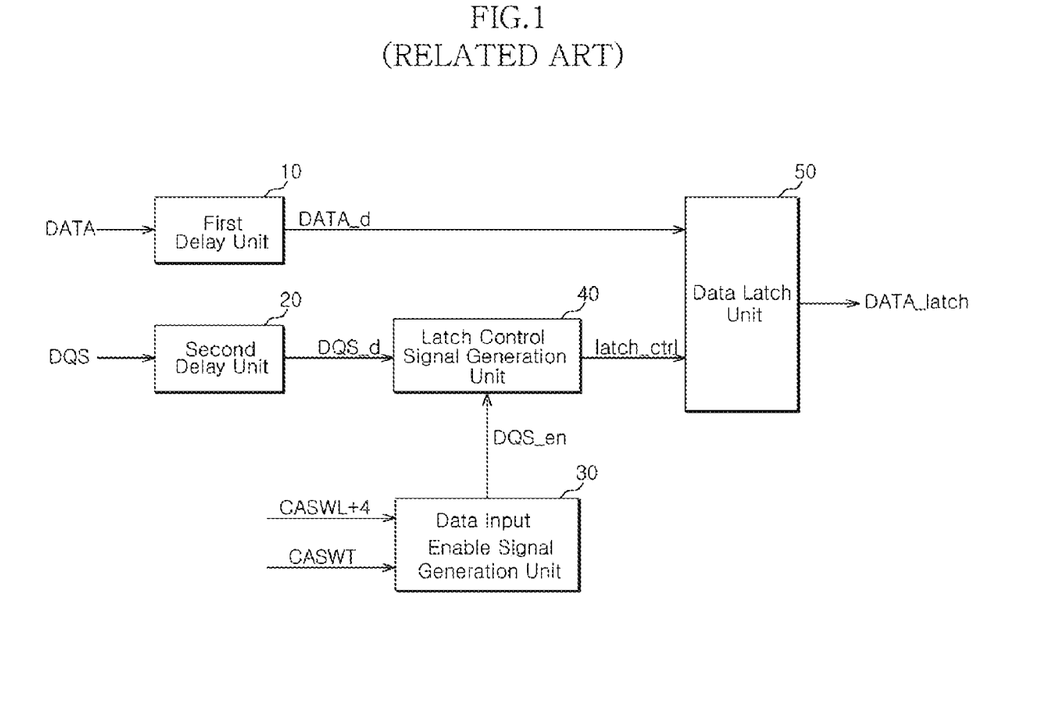
FIG. 1 is a configuration diagram illustrating a typical semiconductor memory apparatus.

FIG. 1 is a configuration diagram illustrating a typical semiconductor memory apparatus. Referring to FIG. 1, a typical semiconductor memory apparatus includes a first delay unit 10, a second delay unit 20, a data input enable signal generation unit 30, a latch control signal generation unit 40, and a data latch unit 50.

The first delay unit 10 delays data DATA inputted from outside to generate delayed data DATA_d.

The second delay unit 20 delays a data strobe signal DQS inputted from outside to generate a delayed data strobe signal DQS_d.

The data input enable signal generation unit 30 generates a data strobe enable signal DQS_en which is activated when a CAS write signal CASWT, which is generated upon receiving a write command, is activated. The data input enable signal generation unit 30 deactivates the data strobe enable signal DQS_en when a CAS write latency signal CASWT+4, which is activated after preset write latency upon receiving the write command, is activated.

The latch control signal generation unit 40 outputs the delayed data strobe signal DQS_d as a latch control signal latch_ctrl during the enable period of the data strobe enable signal DQS_en.

The data latch unit 50 latches the delayed data DATA_d in is response to the latch control signal latch_ctrl and provides latched data DATA_latch to the semiconductor memory apparatus. At this time, a delay time of the first delay unit 10 should be substantially equal to a delay time of the second delay unit 20.

Figure 2:
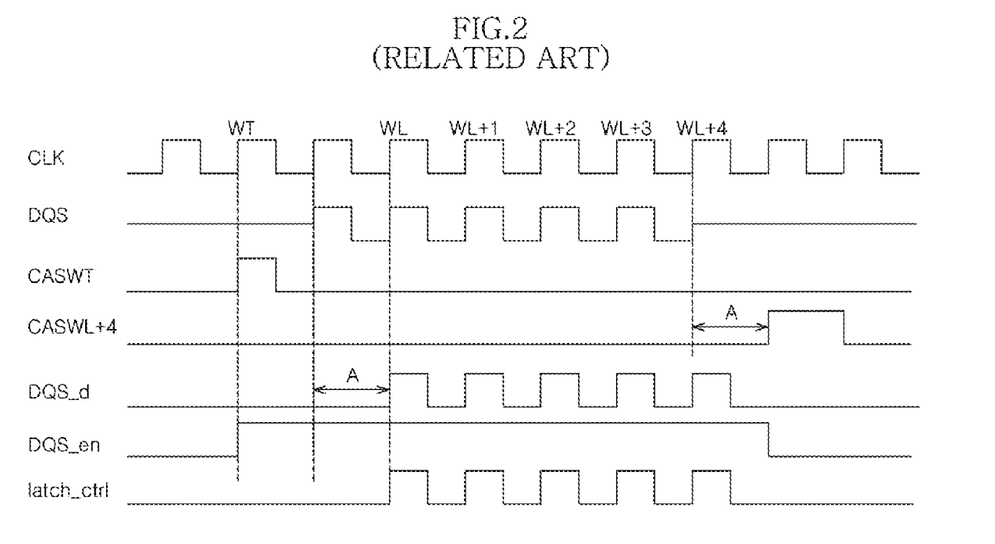
FIG. 2 is a timing diagram explaining the operation of the semiconductor memory apparatus illustrated in FIG. 1.

The operation of the typical semiconductor memory apparatus configured as above will be described in detail with reference to FIG. 2 below.

When the write command WT is inputted to the semiconductor memory apparatus, the CAS write signal CASWT is activated. When two cycles of a clock CLK pass after the write command WT is inputted, write latency WL is counted. FIG. 2 illustrates an example in which write latency is 4. Referring to FIG. 2, the CAS write latency signal CASWT+4 should be activated at the time point WL+4 at which the write latency is 4, but the CAS write latency signal CASWT+4 is activated after a delay time A passes from the time point WL+4 due to internal delay.

The semiconductor memory apparatus delays the data strobe signal DQS by a delay time substantially equal to the delay time A to generate the delayed data strobe signal DQS_d.

The data strobe enable signal DQS_en is activated when the CAS write signal CASWT is activated, and is deactivated when the CAS write latency signal CASWT+4 is activated.

The semiconductor memory apparatus outputs the delayed data strobe signal DQS_d as the latch control signal latch_ctrl during the enable period of the data strobe enable signal DQS_en.

Referring to FIG. 1, the second delay unit 20 has the delay time A. Since the data strobe signal DQS has the delay time A, the delayed data DATA_d inputted to the data latch unit 50 should also be inputted to the data latch unit 50 after the delay time A passes. Thus, the first delay unit 10 is designed to have a delay time substantially equal to that of the second delay unit 20.

The data strobe signal DQS is toggled with the same phase as the clock CLK or has a high impedance state high-z (an intermediate level between a low level and a high level). If the data strobe signal DQS is toggled and enters the high impedance state, a ring back phenomenon may occur in which a voltage level unstably increases and decreases. Since the ring back phenomenon may cause a serious data error in the semiconductor memory apparatus, it is designed that the latch control signal latch_ctrl is generated by delaying the data strobe signal DQS by the delay time A.

However, since the typical semiconductor memory apparatus latches the data DATA through the first delay unit 10 and the second delay unit 20, a data storage speed of the semiconductor memory apparatus is lowered, area efficiency is reduced due to the addition of the delay logic, and power consumption is also increased.

SUMMARY

A semiconductor memory apparatus capable of improving area efficiency and reducing power consumption without lowering a data storage speed is described herein.

In one exemplary aspect of the present invention, a semiconductor memory apparatus includes: a data input enable signal generation block configured to sequentially delay a data strobe signal to generate a first delayed data strobe signal, a second delayed data strobe signal, a third delayed data strobe signal and a fourth delayed data strobe signal, and generate a data strobe enable signal in response to a CAS write signal, a CAS write latency signal and the first to fourth delayed data strobe signals; a latch control signal generation block configured to output the data strobe signal as a latch control signal during an enable period of the data strobe enable signal; and a data latch block configured to latch data in response to the latch control signal and output latched data.

In another exemplary aspect of the present invention, a semiconductor memory apparatus includes: a data input enable signal generation block configured to shift a CAS write latency signal by a first time shorter than one cycle of a data strobe signal, generate shifting CAS write latency signals by repeatedly shifting the shifted signal by the first time, activate a data strobe enable signal in response to a CAS write signal, and deactivate the data strobe enable signal in response to the shifting CAS write latency signals; a latch control signal generation block configured to output the data strobe signal as a latch control signal during an enable period of the data strobe enable signal; and a data latch block configured to latch data in response to the latch control signal and output latched data.

In still another exemplary aspect of the present invention, a semiconductor memory apparatus includes: a data input enable signal generation block configured to sequentially delay a data strobe signal to generate N delayed data strobe signals with N being an integer greater than 1, and generate a data strobe enable signal in response to a CAS write signal, a CAS write latency signal and the N delayed data strobe signals; a latch control signal generation block configured to output the data strobe signal as a latch control signal during an enable period of the data strobe enable signal; and a data latch block configured to latch data in response to the latch control signal and output latched data.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described in detail with reference to the accompanying drawings through exemplary embodiments.

Figure 3:
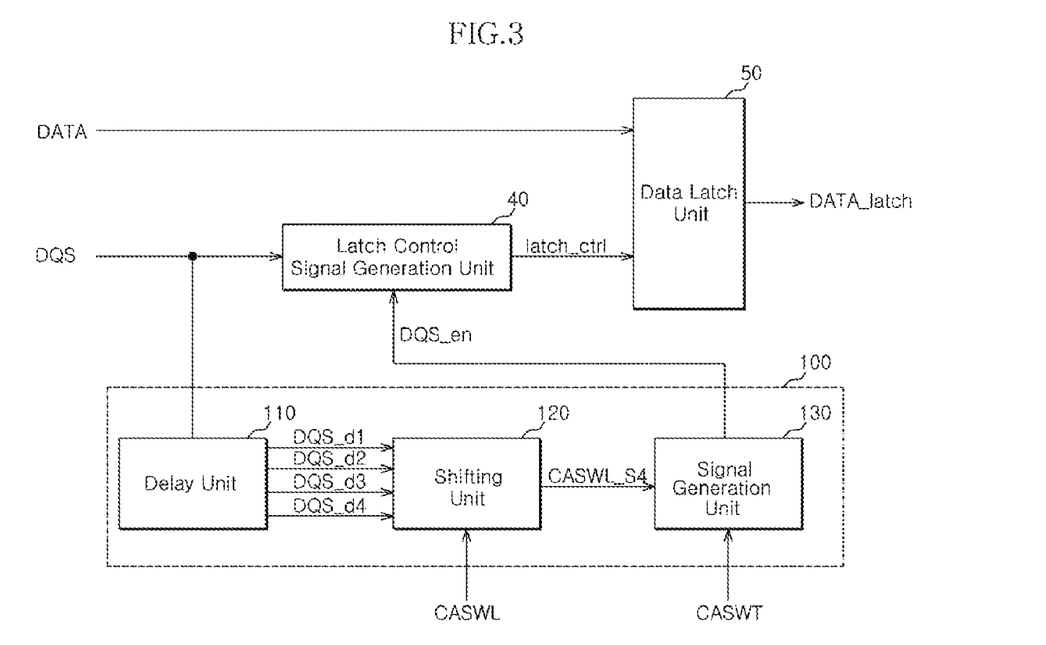
FIG. 3 is a configuration diagram schematically illustrating a semiconductor memory apparatus according to an embodiment of the invention.

FIG. 3 is a configuration diagram schematically illustrating a semiconductor memory apparatus according to one embodiment of the invention. Referring to FIG. 3, the semiconductor memory apparatus according to the embodiment includes a data input enable signal generation block 100, a latch control signal generation block 40, and a data latch block 50.

The data input enable signal generation block 100 is configured to sequentially delay a data strobe signal DQS to generate first to fourth delayed data strobe signals DQS_d1 to DQS_d4, and generate a data strobe enable signal DQS_en in response to a CAS write signal CASWT, a CAS write latency signal CASWL, and the first to fourth delayed data strobe signals DQS_d1 to DQS_d4.

The data input enable signal generation block 100 may include a delay unit 110, a shifting unit 120, and a signal generation unit 130.

The delay unit 110 is configured to sequentially delay the data strobe signal DQS and generate the first to fourth delayed data strobe signals DQS_d1 to DQS_d4.

The shifting unit 120 is configured to generate first to fourth shifting CAS write latency signals (illustrated in FIG. 5, CASWL_S1 to CASWL_S4) in response to the first to fourth delayed data strobe signals DQS_d1 to DQS_d4 and the CAS write latency signal CASWL.

The signal generation unit 130 is configured to activate the data strobe enable signal DQS_en when the CAS write signal CASWT is activated, and deactivate the data strobe enable signal DQS_en when the fourth shifting CAS write latency signal CASWL_S4 is activated.

Figure 4:
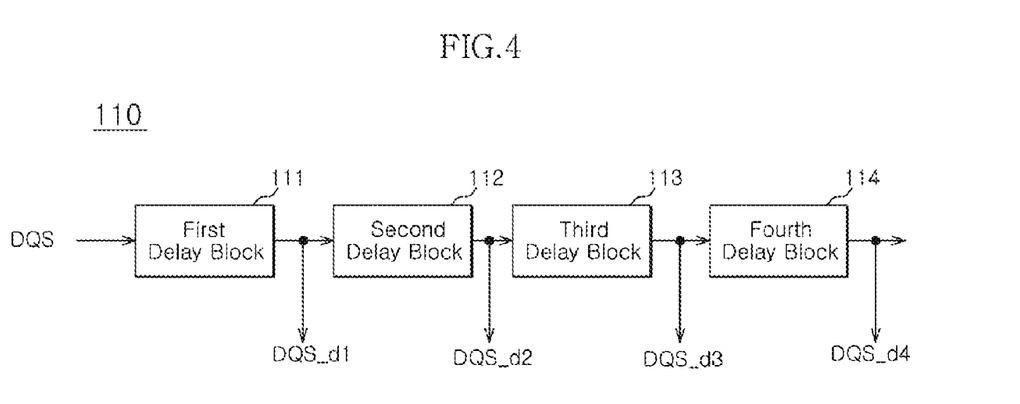
FIG. 4 is a configuration diagram schematically illustrating the delay unit illustrated in FIG. 3.

FIG. 4 is a configuration diagram schematically illustrating the delay unit illustrated in FIG. 3. Referring to FIG. 4, the delay unit 110 includes first to fourth delay sections 111 to 114. While the embodiment describes four delay sections 111 to 114, the number of the delay sections is not limited thereto, and those skilled in the art will be able to choose the optimal number of delay sections depending on the specific implementation.

The first delay section 111 is configured to delay the data strobe signal DQS and generate the first delayed data strobe signal DQS_d1.

The second delay section 112 is configured to delay the first delayed data strobe signal DQS_d1 and generate the second delayed data strobe signal DQS_d2.

The third delay section 113 is configured to delay the second delayed data strobe signal DQS_d2 and generate the third delayed data strobe signal DQS_d3.

The fourth delay section 114 is configured to delay the third delayed data strobe signal DQS_d3 and generate the fourth delayed data strobe signal DQS_d4. At this time, the delay times of the first to fourth delay sections 111 to 114 are shorter than one cycle of the data strobe signal DQS. That is, the first to fourth delay sections 111 to 114 have delay times shorter than one cycle of a clock (illustrated in FIG. 7, CLK).

Figure 5:
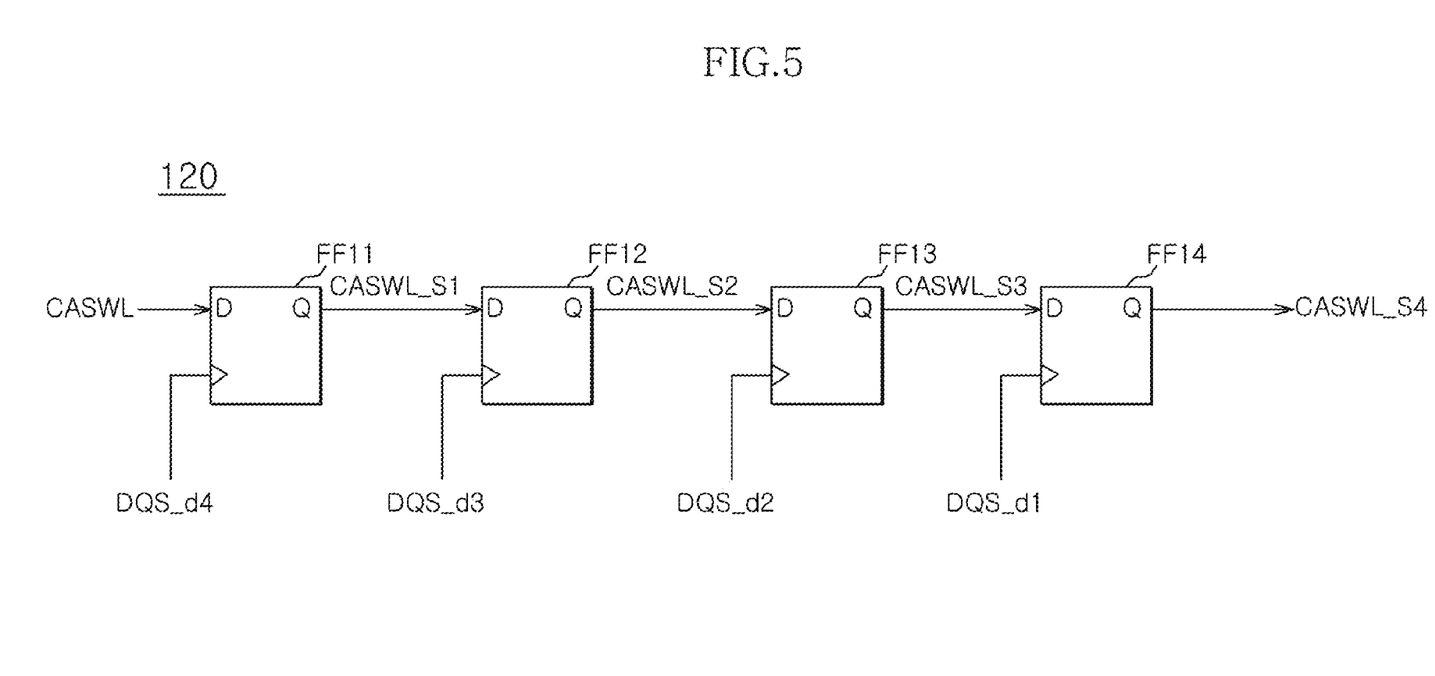
FIG. 5 is a configuration diagram schematically illustrating the shifting unit illustrated in FIG. 3.

FIG. 5 is a configuration diagram schematically illustrating the shifting unit illustrated in FIG. 3. Referring to FIG. 5, the shifting unit 120 includes first to fourth flip-flops FF11 to FF14.

The first flip-flop FF11 is configured to latch the CAS write latency signal CASWL when the fourth delayed data strobe signal DQS_d4 transits to a high level, and output the latched CAS write latency signal CASWL as the first shifting CAS write latency signal CASWL_S1 when the fourth delayed data strobe signal DQS_d4 transits to a low level.

The first flip-flop FF11 receives the CAS write latency signal CASWL through an input terminal thereof, receives the fourth delayed data strobe signal DQS_d4 through a clock input terminal thereof, and outputs the first shifting CAS write latency signal CASWL_S1 through an output terminal thereof.

The second flip-flop FF12 is configured to latch the first shifting CAS write latency signal CASWL_S1 when the third delayed data strobe signal DQS_d3 transits to a high level, and output the latched first shifting CAS write latency signal CASWL_S1 as the second shifting CAS write latency signal CASWL_S2 when the third delayed data strobe signal DQS_d3 transits to a low level.

The second flip-flop FF12 receives the first shifting CAS write latency signal CASWL_S1 through an input terminal thereof, receives the third delayed data strobe signal DQS_d3 through a clock input terminal thereof, and outputs the second shifting CAS write latency signal CASWL_S2 through an output terminal thereof.

The third flip-flop FF13 is configured to latch the second shifting CAS write latency signal CASWL_S2 when the second delayed data strobe signal DQS_d2 transits to a high level, and output the latched second shifting CAS write latency signal CASWL_S2 as the third shifting CAS write latency signal CASWL_S3 when the second delayed data strobe signal DQS_d2 transits to a low level.

The third flip-flop FF13 receives the second shifting CAS write latency signal CASWL_S2 through an input terminal thereof, receives the second delayed data strobe signal DQS_d2 through a clock input terminal thereof, and outputs the third shifting CAS write latency signal CASWL_S3 through an output terminal thereof.

The fourth flip-flop FF14 is configured to latch the third shifting CAS write latency signal CASWL_S3 when the first delayed data strobe signal DQS_d1 transits to a high level, and output the latched third shifting CAS write latency signal CASWL_S3 as the fourth shifting CAS write latency signal CASWL_S4 when the first is delayed data strobe signal DQS_d1 transits to a low level.

The fourth flip-flop FF14 receives the third shifting CAS write latency signal CASWL_S3 through an input terminal thereof, receives the first delayed data strobe signal DQS_d1 through a clock input terminal thereof, and outputs the fourth shifting CAS write latency signal CASWL_S4 through an output terminal thereof.

Figure 6:
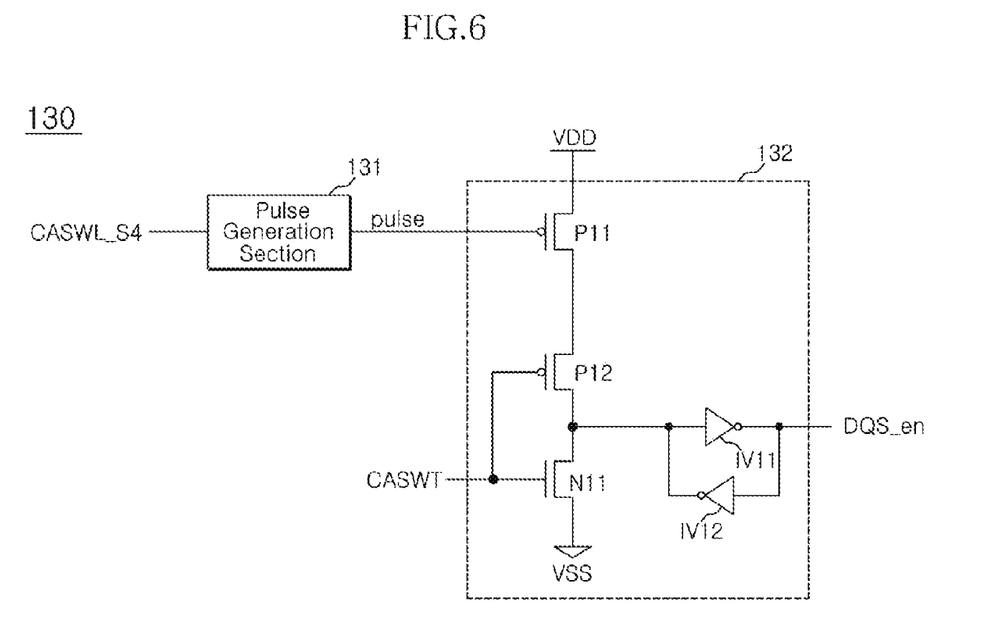
FIG. 6 is a configuration diagram schematically illustrating the signal generation unit illustrated in FIG. 3.

FIG. 6 is a configuration diagram schematically illustrating the signal generation unit illustrated in FIG. 3. Referring to FIG. 6, the signal generation unit 130 includes a pulse generation section 131 and a signal combination section 132.

The pulse generation section 131 is configured to generate a pulse when the fourth shifting CAS write latency signal CASWL_S4 transits to a high level.

The signal combination section 132 is configured to activate the data strobe enable signal DQS_en when the CAS write signal CASWT is activated, and deactivate the data strobe enable signal DQS_en when the pulse is inputted.

The signal combination section 132 includes first to third transistors P11, P12 and N11 and first and second inverters IV11 and IV12. The first transistor P11 receives the pulse through a gate thereof and receives an external voltage VDD through a source thereof. The second transistor P12 receives the CAS write signal CASWT through a gate thereof and has a source coupled to a drain of the first transistor P11. The third transistor N11 receives the CAS write signal CASWT through a gate thereof and has a drain coupled to is a drain of the second transistor P12 and a source coupled to a ground terminal VSS. The first inverter IV11 has an input terminal coupled to a node to which the second transistor P12 and the third transistor N11 are coupled, and outputs the data strobe enable signal DQS_en through an output terminal thereof. The second inverter IV12 has an input terminal coupled to the output terminal of the first inverter IV11 and an output terminal coupled to the input terminal of the first inverter IV11.

The operation of the semiconductor memory apparatus configured as above according to the embodiment of the invention will be described with reference to FIG. 7 below.

The semiconductor memory apparatus sequentially delays the data strobe signal DQS to generate the first to fourth delayed data strobe signals DQS_d1 to DQS_d4.

The semiconductor memory apparatus latches the CAS write latency signal CASWL when the fourth delayed data strobe signal DQS_d4 transits to the high level, and outputs the latched CAS write latency signal CASWL as the first shifting CAS write latency signal CASWL_S1 when the fourth delayed data strobe signal DQS_d4 transits to the low level. Thus, the first shifting CAS write latency signal CASWL_S1 transits to the high level when the fourth delayed data strobe signal DQS_d4 transits to the low level.

The semiconductor memory apparatus latches the first shifting CAS write latency signal CASWL_S1 when the third delayed data strobe signal DQS_d3 transits to the high level, and outputs the latched first shifting CAS write latency signal CASWL_S1 as the second shifting CAS write latency signal CASWL_S2 when the third delayed data strobe signal DQS_d3 transits to the low level. Thus, the second shifting CAS write latency signal CASWL_S2 transits to the high level when the third delayed data strobe signal DQS_d3 transits to the low level.

The semiconductor memory apparatus latches the second shifting CAS write latency signal CASWL_S2 when the second delayed data strobe signal DQS_d2 transits to the high level, and outputs the latched second shifting CAS write latency signal CASWL_S2 as the third shifting CAS write latency signal CASWL_S3 when the second delayed data strobe signal DQS_d2 transits to the low level. Thus, the third shifting CAS write latency signal CASWL_S3 transits to the high level when the second delayed data strobe signal DQS_d2 transits to the low level.

The semiconductor memory apparatus latches the third shifting CAS write latency signal CASWL_S3 when the first delayed data strobe signal DQS_d1 transits to the high level, and outputs the latched third shifting CAS write latency signal CASWL_S3 as the fourth shifting CAS write latency signal CASWL_S4 when the first delayed data strobe signal DQS_d1 transits to the low level. Thus, the fourth shifting CAS write latency signal CASWL_S4 transits to the high level when the first delayed data strobe signal DQS_d1 transits to the low level.

Figure 7:
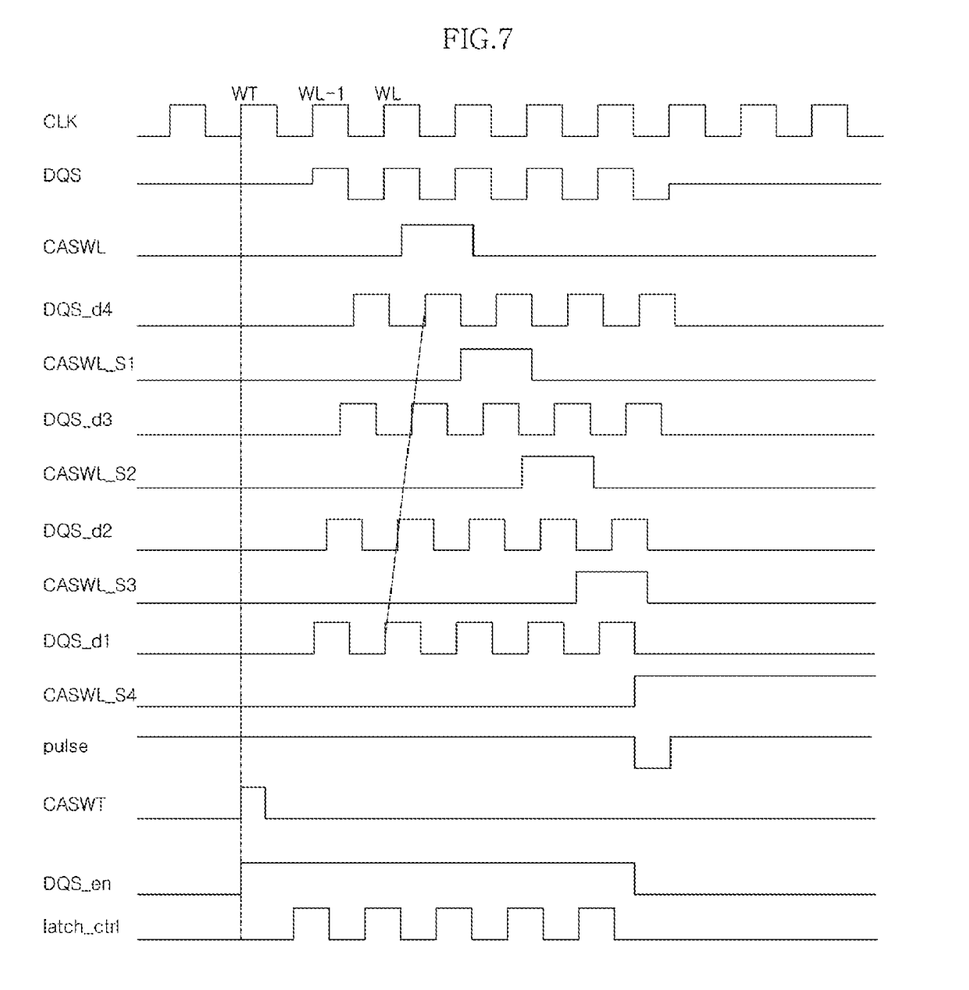
FIG. 7 is a timing diagram explaining the operation of the semiconductor memory apparatus illustrated in FIG. 3.

That is, the delay times of the first to fourth delay sections 111 to 114 illustrated in FIG. 4 are shorter than one cycle of the clock CLK or the data strobe signal DQS illustrated in FIG. 7. It is assumed that one cycle of the clock CLK or the data strobe signal DQS is defined as T and the delay times of the first to fourth delay sections 111 to 114 are defined as T-4, respectively.

The first shifting CAS write latency signal CASWL_S1 generated by shifting the CAS write latency signal CASWL in response to the fourth delayed data strobe signal DQS_d4 is shifted by T-4 as compared with the CAS write latency signal CASWL. The first shifting CAS write latency signal CASWL_S1 is shifted again by T-4 to generate the second shifting CAS write latency signal CASWL_S2. The second shifting CAS write latency signal CASWL_S2 is shifted again by T-4 to generate the third shifting CAS write latency signal CASWL_S3. The third shifting CAS write latency signal CASWL_S3 is shifted again by T-4 to generate the fourth shifting CAS write latency signal CASWL_S4. As a result, the fourth shifting CAS write latency signal CASWL_S4 generated by shifting the CAS write latency signal CASWL by T-4 four times is shifted by 4T-16 as compared with the CAS write latency signal CASWL. The enable timing of the fourth shifting CAS write latency signal CASWL_S4 is advanced by 16 as compared with a result obtained by shifting the CAS write latency signal CASWL four times with one cycle of the clock CLK.

When the fourth shifting CAS write latency signal CASWL_S4 transits to the high level, a pulse activated to a low level for a predetermined time is generated.

The data strobe enable signal DQS_en activated to a high level by the CAS write signal WT is deactivated to a low level when the pulse transits to a low level.

The data strobe signal DQS is outputted as the latch control signal latch_ctrl in the enable period of the data strobe enable signal DQS_en.

Ring back phenomenon which occurs when the data strobe signal DQS is toggled and enters a high impedance state does not occur in the latch control signal latch_ctrl after the data strobe enable signal DQS_en is deactivated.

According to the invention, ring back phenomenon is substantially prevented from occurring, a normal data latch operation is possible without delaying the data strobe signal DQS and the data DATA, and a data storage operation speed is improved as compared with the conventional art. Referring to FIGS. 1 and 3, the two delay units illustrated in FIG. 1 are removed from FIG. 3, so that area efficiency of the semiconductor memory apparatus is improved and power consumed in the delay units can be saved.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a data input enable signal generation block configured to sequentially delay a data strobe signal to generate a first delayed data strobe signal, a second delayed data strobe signal, a third delayed data strobe signal and a fourth delayed data strobe signal, and generate a data strobe enable signal in response to a CAS write signal, a CAS write latency signal and the first to fourth delayed data strobe signals;
a latch control signal generation block configured to output the data strobe signal as a latch control signal during an enable period of the data strobe enable signal; and
a data latch block configured to latch data in response to the latch control signal and output latched data.

2. The semiconductor memory apparatus according to claim 1, wherein the data input enable signal generation block comprises:
a delay unit configured to sequentially delay the data strobe signal and generate the first to fourth delayed data strobe signals;
a shifting unit configured to generate a first shifting CAS write latency signal, a second shifting CAS write latency signal, a third shifting CAS write latency signal and a fourth shifting CAS write latency signal in response to the first to fourth delayed data strobe signals and the CAS write latency signal; and
a signal generation unit configured to activate the data strobe enable signal when the CAS write signal is activated and deactivate the data strobe enable signal when the fourth shifting CAS write latency signal is activated.

3. The semiconductor memory apparatus according to claim 2, wherein the delay unit comprises:
a first delay section configured to delay the data strobe signal and generate the first delayed data strobe signal;
a second delay section configured to delay the first delayed data strobe signal and generate the second delayed data strobe signal;
a third delay section configured to delay the second delayed data strobe signal and generate the third delayed data strobe signal; and
a fourth delay section configured to delay the third delayed data strobe signal and generate the fourth delayed data strobe signal.

4. The semiconductor memory apparatus according to claim 2, wherein the shifting unit comprises:
a first flip-flop configured to latch the CAS write latency signal when the fourth delayed data strobe signal transits to a high level, and output the latched CAS write latency signal as the first shifting CAS write latency signal when the fourth delayed data strobe signal transits to a low level;
a second flip-flop configured to latch the first shifting CAS write latency signal when the third delayed data strobe signal transits to a high level, and output the latched first shifting CAS write latency signal as the second shifting CAS write latency signal when the third delayed data strobe signal transits to a low level;
a third flip-flop configured to latch the second shifting CAS write latency signal when the second delayed data strobe signal transits to a high level, and output the latched second shifting CAS write latency signal as the third shifting CAS write latency signal when the second delayed data strobe signal transits to a low level; and
a fourth flip-flop configured to latch the third shifting CAS write latency signal when the first delayed data strobe signal transits to a high level, and output the latched third shifting CAS write latency signal as the fourth shifting CAS write latency signal when the first delayed data strobe signal transits to a low level.

5. The semiconductor memory apparatus according to claim 2, wherein the signal generation unit comprises:
a pulse generation section configured to generate a pulse when the fourth shifting CAS write latency signal transits to a high level; and
a signal combination section configured to activate the data strobe enable signal when the CAS write signal is activated and deactivate the data strobe enable signal when the pulse is inputted.

6. A semiconductor memory apparatus comprising:
a data input enable signal generation block configured to shift a CAS write latency signal by a first time shorter than one cycle of a data strobe signal, generate shifting CAS write latency signals by repeatedly shifting the shifted signal by the first time, activate a data strobe enable signal in response to a CAS write signal, and deactivate the data strobe enable signal in response to the shifting CAS write latency signals;
a latch control signal generation block configured to output the data strobe signal as a latch control signal during an enable period of the data strobe enable signal; and
a data latch block configured to latch data in response to the latch control signal and output latched data.

7. The semiconductor memory apparatus according to claim 6, wherein the data input enable signal generation block comprises:
a delay unit configured to sequentially delay the data strobe signal and generate first to fourth delayed data strobe signals;
a shifting unit configured to generate a first shifting CAS write latency signal, a second shifting CAS write latency signal, a third shifting CAS write latency signal and a fourth shifting CAS write latency signal in response to the first to fourth delayed data strobe signals and the CAS write latency signal; and
a signal generation unit configured to activate the data strobe enable signal when the CAS write signal is activated and deactivate the data strobe enable signal when the fourth shifting CAS write latency signal is activated.

8. The semiconductor memory apparatus according to claim 7, wherein the delay unit comprises:
a first delay section configured to delay the data strobe signal and generate the first delayed data strobe signal;
a second delay section configured to delay the first delayed data strobe signal and generate the second delayed data strobe signal;
a third delay section configured to delay the second delayed data strobe signal and generate the third delayed data strobe signal; and a fourth delay section configured to delay the third delayed data strobe signal and generate the fourth delayed data strobe signal.

9. The semiconductor memory apparatus according to claim 7, wherein the shifting unit comprises:
a first flip-flop configured to latch the CAS write latency signal when the fourth delayed data strobe signal transits to a high level, and output the latched CAS write latency signal as the first shifting CAS write latency signal when the fourth delayed data strobe signal transits to a low level;
a second flip-flop configured to latch the first shifting CAS write latency signal when the third delayed data strobe signal transits to a high level, and output the latched first shifting CAS write latency signal as the second shifting CAS write latency signal when the third delayed data strobe signal transits to a low level;
a third flip-flop configured to latch the second shifting CAS write latency signal when the second delayed data strobe signal transits to a high level, and output the latched second shifting CAS write latency signal as the third shifting CAS write latency signal when the second delayed data strobe signal transits to a low level; and
a fourth flip-flop configured to latch the third shifting CAS write latency signal when the first delayed data strobe signal transits to a high level, and output the latched third shifting CAS write latency signal as the fourth shifting CAS write latency signal when the first delayed data strobe signal transits to a low level.

10. The semiconductor memory apparatus according to claim 7, wherein the signal generation unit comprises:
a pulse generation section configured to generate a pulse when the fourth shifting CAS write latency signal transits to a high level; and
a signal combination section configured to activate the data strobe enable signal when the CAS write signal is activated and deactivate the data strobe enable signal when the pulse is inputted.

11. A semiconductor memory apparatus comprising:
a data input enable signal generation block configured to sequentially delay a data strobe signal to generate N delayed data strobe signals with N being an integer greater than 1, and generate a data strobe enable signal in response to a CAS write signal, a CAS write latency signal and the N delayed data strobe signals;
a latch control signal generation block configured to output the data strobe signal as a latch control signal during an enable period of the data strobe enable signal; and
a data latch block configured to latch data in response to the latch control signal and output latched data.

12. The semiconductor memory apparatus according to claim 11, wherein the data input enable signal generation block comprises:
a delay unit configured to sequentially delay the data strobe signal and generate the N delayed data strobe signals;
a shifting unit configured to sequentially generate N shifting CAS write latency signals in response to the N delayed data strobe signals and the CAS write latency signal; and
a signal generation unit configured to activate the data strobe enable signal when the CAS write signal is activated and deactivate the data strobe enable signal when the N-th shifting CAS write latency signal is activated.

13. The semiconductor memory apparatus according to claim 12, wherein the delay unit comprises:
a first to N-th delay sections connected in cascade, wherein the first delay section is configured to delay the data strobe signal to generate the first delayed data strobe signal, i-th delay section is configured to delay the i−1 th delayed data strobe signal and generate the i-th delayed data strobe signal, wherein i is an integer from 2 to N.

14. The semiconductor memory apparatus according to claim 12, wherein the shifting unit comprises a first to N-th flip-flops connected in cascade, wherein the first flip-flop is configured to latch the CAS write latency signal when the N-th delayed data strobe signal transits to a high level, and output the latched CAS write latency signal as the first shifting CAS write latency signal when the N-th delayed data strobe signal transits to a low level; and
wherein the i-th flip-flop is configured to latch the i−1 th shifting CAS write latency signal when the N-i+1 th delayed data strobe signal transits to a high level, and output the latched i−1 th shifting CAS write latency signal as the i th shifting CAS write latency signal when the N-i+1 th delayed data strobe signal transits to a low level, wherein i is an integer from 2 to N.

15. The semiconductor memory apparatus according to claim 12, wherein the signal generation unit comprises:
a pulse generation section configured to generate a pulse when the N-th shifting CAS write latency signal transits to a high level; and
a signal combination section configured to activate the data strobe enable signal when the CAS write signal is activated and deactivate the data strobe enable signal when the pulse is inputted.

* * * * *